United States Patent
Wheeler et al.

(10) Patent No.: US 10,860,748 B2
(45) Date of Patent: Dec. 8, 2020

(54) SYSTEMS AND METHOD FOR ADJUSTING PROPERTIES OF OBJECTS DEPICTED IN COMPUTER-AID DESIGN APPLICATIONS

(71) Applicant: General Electric Company, Schenectady, NY (US)

(72) Inventors: Brian Christopher Wheeler, Simpsonville, SC (US); Jason Anton Byers, Greenville, SC (US); Prashant Madhukar Kulkarni, Simpsonville, SC (US)

(73) Assignee: General Electric Company, Schenectady, NY (US)

( * ) Notice: Subject to any disclaimer, the term of this patent is extended or adjusted under 35 U.S.C. 154(b) by 429 days.

(21) Appl. No.: 15/453,448

(22) Filed: Mar. 8, 2017

(65) Prior Publication Data
US 2018/0260494 A1 Sep. 13, 2018

(51) Int. Cl.
*G06F 30/00* (2020.01)
*G06T 19/20* (2011.01)

(52) U.S. Cl.
CPC ............... *G06F 30/00* (2020.01); *G06T 19/20* (2013.01)

(58) Field of Classification Search
CPC .......... G06F 17/50; G06F 30/00; G06F 30/10; G06F 30/12; G06F 2111/00; G06F 2111/02; G06F 2111/10
USPC ............................................................. 703/1
See application file for complete search history.

(56) References Cited

U.S. PATENT DOCUMENTS

| | | | | |
|---|---|---|---|---|
| 5,297,241 A * | 3/1994 | Hirr, Jr. | ................... | G06T 17/10 345/427 |
| 6,611,725 B1 * | 8/2003 | Harrison | ................. | G06T 19/00 345/420 |
| 7,216,293 B2 * | 5/2007 | Kataoka | ................... | G09G 5/14 715/246 |
| 7,916,157 B1 * | 3/2011 | Kelley | ................. | G06Q 10/109 345/619 |
| 8,443,280 B2 * | 5/2013 | Noyes | ................... | G06F 40/169 715/230 |
| 8,515,982 B1 * | 8/2013 | Hickman | ................. | G06F 30/00 707/758 |
| 9,262,863 B2 * | 2/2016 | Yadav | ..................... | G06F 30/17 |

(Continued)

FOREIGN PATENT DOCUMENTS

| | | | |
|---|---|---|---|
| JP | H05233738 A | 10/1993 | |
| JP | H11120385 A | 4/1999 | |

OTHER PUBLICATIONS

Kade King (A Beginner's Guide to annotation scaling in AutoCad, AutoDesk AutoCAD, 2017, pp. 1-18) (Year: 2017).*

(Continued)

*Primary Examiner* — Iftekhar A Khan
(74) *Attorney, Agent, or Firm* — Fletcher Yoder P.C.

(57) ABSTRACT

A system includes a display, a processor, and memory storing instructions that cause the processor to receive a request to scale one or more objects of on a model depicted on the display, identify the one or more objects of the model, determine one or more model parameters of the model, such that the model parameters include information indicative of the one or more objects, the model, the display, or any combination thereof, calculate a size for the one or more objects of the model based on the one or more model parameters; and scale the one or more objects based on the size for the objects.

16 Claims, 5 Drawing Sheets

(56) References Cited

U.S. PATENT DOCUMENTS

| | | | | |
|---|---|---|---|---|
| 9,519,407 | B2* | 12/2016 | Loberg | G06F 30/13 |
| 9,582,930 | B2* | 2/2017 | Chen | G06T 19/003 |
| 10,062,039 | B1* | 8/2018 | Lockett | G06N 20/00 |
| 2002/0089549 | A1* | 7/2002 | Munro | G06T 11/60 715/835 |
| 2002/0118187 | A1* | 8/2002 | Batori | G06T 19/00 345/419 |
| 2002/0188664 | A1* | 12/2002 | Hultgren | H04L 29/06 709/203 |
| 2003/0158855 | A1* | 8/2003 | Farnham | G06F 3/0481 |
| 2004/0102245 | A1* | 5/2004 | Escalera | G07F 17/3211 463/32 |
| 2004/0146199 | A1* | 7/2004 | Berkner | G06F 16/9577 382/176 |
| 2004/0225962 | A1* | 11/2004 | Ohashi | G06F 40/166 715/247 |
| 2004/0233222 | A1* | 11/2004 | Lee | G06F 3/04815 345/621 |
| 2005/0108215 | A1* | 5/2005 | Thomas | G06T 15/005 |
| 2005/0172222 | A1* | 8/2005 | Andrew | G06F 9/451 715/252 |
| 2005/0231512 | A1* | 10/2005 | Niles | G06T 13/00 345/473 |
| 2006/0044307 | A1* | 3/2006 | Song | G06Q 10/06398 345/419 |
| 2006/0053364 | A1* | 3/2006 | Hollander | G06F 40/169 715/232 |
| 2006/0085743 | A1* | 4/2006 | Baudisch | G06F 40/106 715/273 |
| 2006/0103667 | A1* | 5/2006 | Amit | G06F 40/103 345/619 |
| 2006/0284738 | A1* | 12/2006 | Mori | G08G 1/0962 340/995.14 |
| 2008/0104535 | A1* | 5/2008 | DeLine | G06F 3/0483 715/785 |
| 2008/0180460 | A1* | 7/2008 | Ford | G06F 30/00 345/661 |
| 2008/0269942 | A1* | 10/2008 | Free | G06F 30/00 700/182 |
| 2009/0063557 | A1* | 3/2009 | MacPherson | G06N 5/02 |
| 2009/0063948 | A1* | 3/2009 | Finn | G06F 40/166 715/230 |
| 2009/0074265 | A1* | 3/2009 | Huang | G06T 7/0012 382/128 |
| 2009/0187385 | A1* | 7/2009 | Zegdoun | G06T 15/40 703/1 |
| 2011/0043644 | A1* | 2/2011 | Munger | H04N 13/344 348/207.1 |
| 2011/0126119 | A1* | 5/2011 | Young | G06F 3/048 715/744 |
| 2011/0131535 | A1* | 6/2011 | Tagami | G06T 1/00 715/838 |
| 2013/0069915 | A1* | 3/2013 | Kukulj | G06F 40/169 345/175 |
| 2014/0210824 | A1* | 7/2014 | Hadley | G06F 16/93 345/427 |
| 2014/0225887 | A1* | 8/2014 | Aguirre-Valencia | G06T 15/20 345/419 |
| 2014/0298153 | A1* | 10/2014 | Tsujimoto | G06F 3/0484 715/232 |
| 2015/0055085 | A1* | 2/2015 | Fonte | G06F 30/00 351/178 |
| 2016/0004401 | A1* | 1/2016 | McCommons | G06F 3/0485 715/723 |
| 2016/0004996 | A1* | 1/2016 | Hoffmann | G06Q 10/06 715/773 |
| 2016/0042497 | A1* | 2/2016 | Gopalakrishnan | G06F 40/106 715/252 |
| 2016/0054889 | A1* | 2/2016 | Hadley | G06F 30/00 715/849 |
| 2016/0055665 | A1* | 2/2016 | Floyd | G09G 5/02 345/419 |
| 2016/0062954 | A1* | 3/2016 | Ruff | G06F 8/41 715/249 |
| 2016/0070686 | A1* | 3/2016 | Yu | G06K 9/222 715/230 |
| 2016/0070687 | A1* | 3/2016 | Shigeta | G06F 40/169 715/232 |
| 2016/0070688 | A1* | 3/2016 | Yao | G06F 40/106 715/232 |
| 2016/0275180 | A1* | 9/2016 | Matskevich | G06F 16/3344 |
| 2016/0335798 | A1* | 11/2016 | Datta | G06T 7/251 |
| 2017/0116352 | A1* | 4/2017 | Kohlhoff | G06Q 10/06 |
| 2017/0148227 | A1* | 5/2017 | Alsaffar | G06T 11/60 |
| 2017/0323449 | A1* | 11/2017 | Aonuma | G06T 7/20 |
| 2018/0005454 | A1* | 1/2018 | Suni | G06T 19/003 |
| 2018/0330544 | A1* | 11/2018 | Corso | G06Q 30/0643 |

OTHER PUBLICATIONS

Hengel et al. ("Hierarchical model fitting to 2D and 3D data", IEEE, 2006, pp. 1-6) (Year: 2006).*

PCT International Search Report and Written Opinion; Application No. PCT/US2018/019727; dated Jun. 4, 2018; 13 pages.

* cited by examiner

SYSTEMS AND METHOD FOR ADJUSTING PROPERTIES OF OBJECTS DEPICTED IN COMPUTER-AID DESIGN APPLICATIONS

The subject matter disclosed herein relates to systems and methods for modifying objects, such as annotations on digital product definition (e.g., rendered 3D models that may contain annotations) for industrial machine parts depicted in design applications.

Industrial machines, such as gas turbine systems, may provide for the generation of power. For example, the gas turbine systems typically include a compressor for compressing a working fluid, such as air, a combustor for combusting the compressed working fluid with fuel, and a turbine for turning the combusted fluid into a rotative power. Generally, the compressed air is injected into a combustor, which heats the fluid causing it to expand, and the expanded fluid is forced through the gas turbine. The gas turbine may then convert the expanded fluid into rotative power, for example, by a series of blade stages. The rotative power may then be used to drive a load, which may include an electrical generator producing electrical power and electrically coupled to a power distribution grid.

Industrial machines and machine parts may be designed for a particular purpose, such as a compressor blade designed to compress air. The machine or part may then be annotated with product definition for the purpose of manufacturing the machine or part. It may be beneficial to improve the design and manufacturing of the machine and machine parts by legibly including annotations such as manufacturing details on a model view of the part.

BRIEF DESCRIPTION

Certain embodiments commensurate in scope with the original claims are summarized below. These embodiments are not intended to limit the scope of the claims, but rather these embodiments are intended only to provide a brief summary of possible forms of the embodiments disclosed herein. Indeed, the disclosed embodiments may encompass a variety of forms that may be similar to or different from the embodiments set forth below.

In a first embodiment, a system includes a display, a processor, and memory storing instructions that cause the processor to receive a request to scale one or more objects of on a model depicted on the display, identify the one or more objects of the model, determine one or more model parameters of the model, such that the model parameters include information indicative of the one or more objects, the model, the display, or any combination thereof, calculate a size for the one or more objects of the model based on the one or more model parameters; and scale the one or more objects based on the size for the objects.

In a second embodiment, a method includes receiving, via a processor, a request via a user interface to scale one or more objects of on a model depicted on a display. Furthermore, the method includes identifying, via the processor, the one or more objects of the model, determining, via the processor, one or more model parameters of the model, wherein the one or more model parameters comprise information indicative of the one or more objects, the model, the display, or any combination thereof, calculating, via the processor, a size for the one or more objects of the model based on the one or more model parameters and scaling, via the processor, the one or more objects based on the size for the objects.

In a third embodiment, a tangible, non-transitory, and computer-readable medium having instructions stored thereon that, when executed by one or more processors of a computer-aided design (CAD) system, cause the one or more processors to receive a request to scale one or more objects of on a model depicted on a display, identify the one or more objects of the model, determine one or more model parameters of the model, such that the model parameters include information indicative of the one or more objects, the model, the display, or any combination thereof, calculate a size for the one or more objects of the model based on the one or more model parameters, and scale the one or more objects based on the size for the one or more objects.

BRIEF DESCRIPTION OF THE DRAWINGS

These and other features, aspects, and advantages of the presently disclosed embodiments will become better understood when the following detailed description is read with reference to the accompanying drawings in which like characters represent like parts throughout the drawings, wherein.

DETAILED DESCRIPTION

Figure 1:
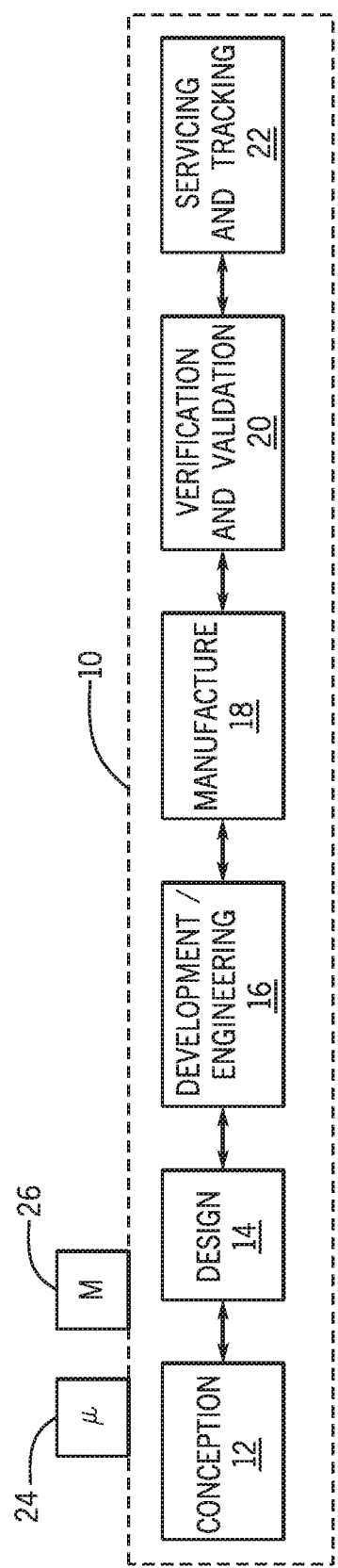
FIG. 1 is a block diagram of an embodiment of a computer-aided technology (CAx) system, in accordance with an aspect of the present disclosure.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Designing a machine or part may include certain systems and methods described in more detail below that produce a part design. For example, the part design may be created as a model-based definition included in a 3-dimensional (3D) computer aided design (CAD) model. After creating the CAD part, a depiction of the CAD part, hereinafter referred to as "a digital product definition," may be generated by a computer-aided technology (CAx) system, whereby the digital product definition may be used to help facilitate manufacture the part. In certain embodiments, the digital product definition may include a 2-dimensional (2D) and/or 3D depiction (e.g., model) of the part. Furthermore, the digital product definition may include objects such as, annotations (e.g., callouts, text, etc.), that may be displayed on the model, in some instances. It should be noted that while "annotations," used hereinafter to refer to objects displayed on 3D models such as, digital product definitions, the systems and methods described above and below are applicable to any objects displayed on the model such as graphics (e.g., arrows, shapes, etc.), tables (e.g., bill of materials, etc.), and the like.

With the following in mind, the annotations displayed on the digital product definition may vary in size. Furthermore, additional digital product definitions may be generated to add clarity to details indicative of the manufacturing of certain features of the part. As such, the additional digital product definitions may include illustrations of views different than the first view generated. Such additional digital product definitions may also contain annotations that vary in size. Furthermore, additional digital product definitions may be generated, such that the additional digital product definitions show amplified or minimized views of the part to focus on certain features of the part, causing the annotations displayed on the digital product definition to also become amplified and/or minimized accordingly. As such, the annotations may become difficult to view (e.g., illegible and inconsistent).

To correct the annotations of different versions of a digital product definition, and thereby make the annotation on the digital product definitions more legible, the CAx system that generates the digital product definitions may scale the annotations displayed on the various digital product definitions to a suitable size. For instance, the CAx system may receive information indicative of the size of the display (e.g., page, screen, etc.) that will illustrate the digital product definition and calculate a suitable size (e.g., text size) for the annotation based at least in part on the size of the display. The CAx system may then modify the size of the annotations based on the suitable size.

With the foregoing in mind, it may be useful to describe a computer-aided technologies (CAx) system that may incorporate the techniques described herein, for example to improve the generation of annotations on part digital product definitions. Accordingly, FIG. 1 illustrates an embodiment of a CAx system 10 suitable for providing for a variety of processes, including product lifecycle management (PLM) processes 12, 14, 16, 18, 20, 22. In the depicted embodiment, the CAx system 10 may include support for execution of conception processes 12. For example, the conception processes 12 may produce a set of specifications such as requirements specifications documenting a set of requirements to be satisfied by a design, a part, a product, or a combination thereof. The conception processes 12 may also produce a concept or prototype for the part or product (e.g., machine). A series of design processes 14 may then use the specifications and/or prototype to produce, for example, one or more 3-dimensional (3D) design models of the part or product. The 3D design models may include solid/surface modeling, parametric models, wireframe models, vector models, non-uniform rational basis spline (NURBS) models, geometric models, 2-dimensional (2D) manufacturing part and assembly digital product definitions, and the like.

Design models may then be further refined and added to via the execution of development/engineering processes 16. The development/engineering processes may, for example, create and apply models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models that may be used to predict the behavior of the part or product during its operation. For example, turbine blades may be modeled to predict fluid flows, pressures, clearances, and the like, during operations of a gas turbine engine. The development/engineering processes 16 may additionally result in tolerances, materials specifications (e.g., material type, material hardness), clearance specifications, and the like.

The CAx system 10 may additionally provide for manufacturing processes 18 that may include manufacturing automation support. For example, additive manufacturing models may be derived, such as 3D printing models for material jetting, binder jetting, vat photopolymerization, powder bed fusion, sheet lamination, directed energy deposition, material extrusion, and the like, to create the part or product. Other manufacturing models may be derived, such as computer numeric control (CNC) models with G-code to machine or otherwise remove material to produce the part or product (e.g., via milling, lathing, plasma cutting, wire cutting, and so on). Bill of materials (BOM) creation, requisition orders, purchasing orders, and the like, may also be provided as part of the manufacture processes 18 (or other PLM processes).

The CAx system 10 may additionally provide for verification and/or validation processes 20 that may include automated inspection of the part or product as well as automated comparison of specifications, requirements, and the like. In one example, a coordinate-measuring machine (CMM) process may be used to automate inspection of the part or product. After the part is inspected, results from the CMM process may be automatically generated via an electronic Characteristic Accountability & Verification (eCAV) system.

A servicing and tracking set of processes 22 may also be provided via the CAx system 10. The servicing and tracking processes 22 may log maintenance activities for the part, part replacements, part life (e.g., in fired hours), and so on. As illustrated, the CAx system 10 may include feedback between the processes 12, 14, 16, 18, 20, 22. For example, data from services and tracking processes 22, for example, may be used to redesign the part or product via the design processes 14. Indeed, data from any one of the processes 12, 14, 16, 18, 20, 22 may be used by any other of the processes 12, 14, 16, 18, 20, 22 to improve the part or product or to create a new part or a new product. In this manner, the CAx system 10 may incorporate data from downstream processes and use the data to improve the part or to create a new part.

The CAx system 10 may additionally include one or more processors 24 and a memory system 26 that may execute software programs to perform the disclosed techniques. Moreover, the processors 24 may include multiple microprocessors, one or more "general-purpose" microprocessors, one or more special-purpose microprocessors, and/or one or more application specific integrated circuits (ASICS), or some combination thereof. For example, the processors 24 may include one or more reduced instruction set (RISC) processors. The memory system 26 may store information such as control software, look up tables, configuration data, etc. The memory system 26 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Figure 2:
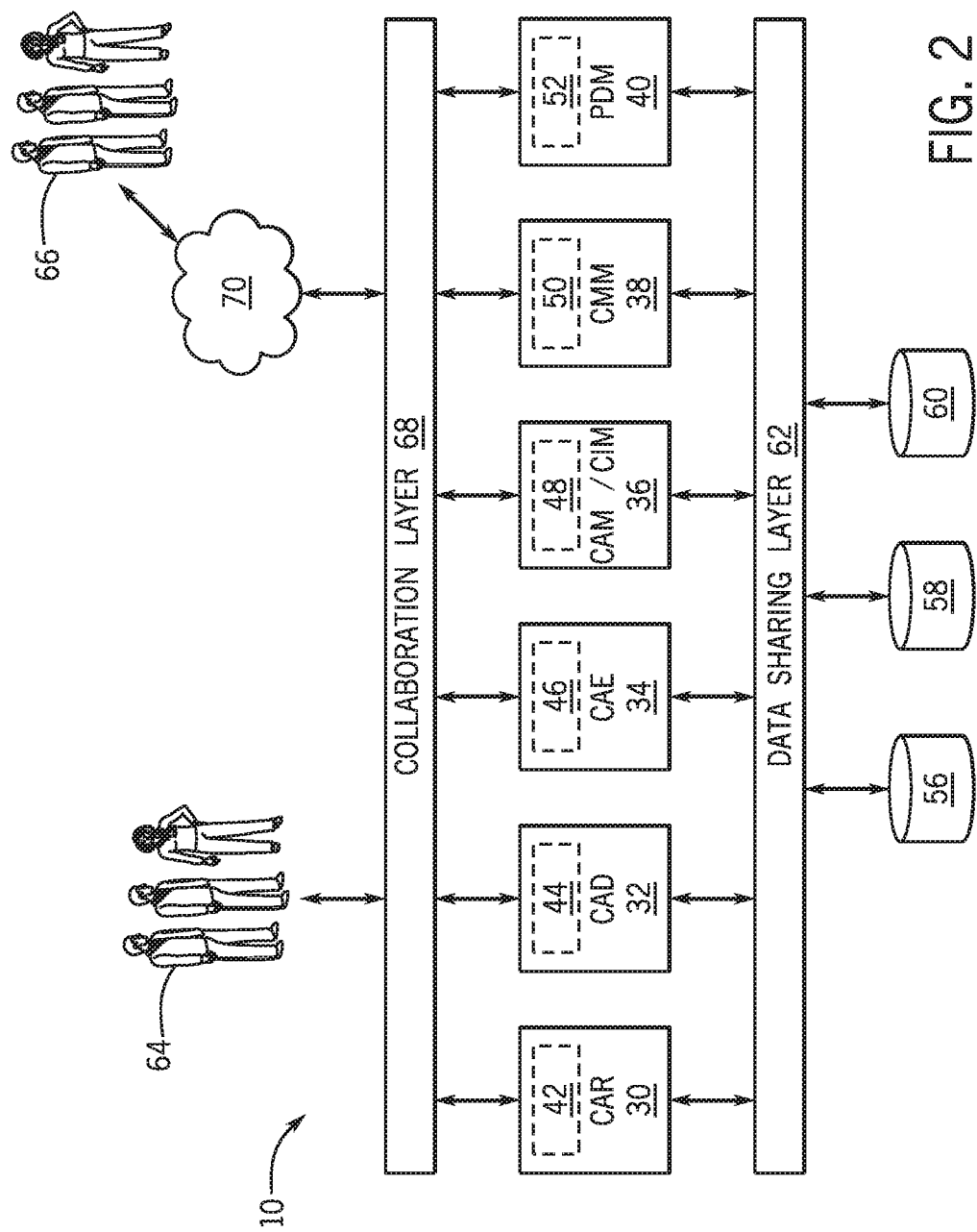
FIG. 2 is a block diagram of a certain components of the CAx system of FIG. 1, in accordance with an aspect of the present disclosure.

The memory system 26 may store a variety of information, which may be suitable for various purposes. For example, the memory system 26 may store machine-readable and/or processor-executable instructions (e.g., firmware or software) for the processors' 24 execution. In one embodiment, the executable instructions include instructions for a number of PLM systems, for example software systems, as shown in the embodiment of FIG. 2. More specifically, the CAx system 10 embodiment illustrates a computer-aided requirements capture (CAR) system 30, a computer-aided design (CAD) system 32, a computer-aided engineering (CAE) system 34, computer-aided manufacturing/computer-integrated manufacturing (CAM/CIM) system 36, a coordinate-measuring machine (CMM) system 38, and a product data management (PDM) system 40. Each of the systems 30, 32, 34, 36, 38 and 40 may be extensible and/or customizable, accordingly, each system 30 may include an extensibility and customization system 42, 44, 46, 48, 50, and 52, respectively. Additionally, each of the systems 30, 32, 34, 36, 38 and 40 may be stored in a memory system, such as memory system 26, and may be executable via a processor, such as via processors 24.

In the depicted embodiment, the CAR system 30 may provide for entry of requirements and/or specifications, such as dimensions for the part or product, operational conditions that the part or product is expected to encounter (e.g., temperatures, pressures), certifications to be adhered to, quality control requirements, performance requirements, and so on. The CAD system 32 may provide for a graphical user interface suitable to create and manipulate graphical representations of 2D and/or 3D models, as described above with respect to the design processes 14. For example, the 3D design models may include solid/surface modeling, parametric models, wireframe models, vector models, non-uniform rational basis spline (NURBS) models, geometric models, and the like. The CAD system 32 may provide for the creation and update of the 2D and/or 3D models and related information (e.g., model views, drawings, annotations, notes, callout, etc.). Indeed, the CAD system 32 may combine a graphical representation of the part or product with other, related information. Further, the CAD system 32 may adjust the annotations displayed on various models displaying multiple views and/or orientations of the same part, as discussed in detail in FIG. 4.

The CAE system 34 may enable creation of various engineering models, such as the models described above with respect to the development/engineering processes 16. For example, the CAE system 34 may apply engineering principles to create models such as thermodynamic models, low cycle fatigue (LCF) life prediction models, multibody dynamics (MBD) and kinematics models, computational fluid dynamics (CFD) models, finite element analysis (FEA) models, and/or 3-dimension to 2-dimension FEA mapping models. The CAE system 34 may then apply the aforementioned models to analyze certain part or product properties (e.g., physical properties, thermodynamic properties, fluid flow properties, and so on), for example, to better match the requirements and specifications for the part or product.

The CAM/CIM system 36 may provide for certain automation and manufacturing efficiencies, for example, by deriving certain programs or code (e.g., G-code) and then executing the programs or code to manufacture the part or product. The CAM/CIM system 36 may support certain automated manufacturing techniques, such as additive (or subtractive) manufacturing techniques, including material jetting, binder jetting, vat photopolymerization, powder bed fusion, sheet lamination, directed energy deposition, material extrusion, milling, lathing, plasma cutting, wire cutting, or a combination thereof. The CMM system 38 may include machinery to automate inspections. For example, probe-based, camera-based, and/or sensor-based machinery may automatically inspect the part or product to ensure compliance with certain design geometries, tolerances, shapes, and so on.

The PDM system 40 may be responsible for the management and publication of data from the systems 30, 32, 34, 36, and/or 38. For example, the systems 30, 32, 34, 36, and/or 38 may communicate with data repositories 56, 58, 60 via a data sharing layer 62. The PDM system 40 may then manage collaboration between the systems 30, 32, 34, 36, and/or 38 by providing for data translation services, versioning support, archive management, notices of updates, and so on. The PDM system 40 may additionally provide for business support such as interfacing with supplier/vendor systems and/or logistics systems for purchasing, invoicing, order tracking, and so on. The PDM system 40 may also interface with service/logging systems (e.g., service center data management systems) to aid in tracking the maintenance and life cycle of the part or product as it undergoes operations. Teams 64, 66 may collaborate with team members via a collaboration layer 68. The collaboration layer may include web interfaces, messaging systems, file drop/pickup systems, and the like, suitable for sharing information and a variety of data. The collaboration layer 68 may also include cloud-based systems 70 or communicate with the cloud-based systems 70 that may provide for decentralized computing services and file storage. For example, portions (or all) of the systems 30, 32, 34, 36, 38 may be stored in the cloud 70 and/or accessible via the cloud 70.

The extensibility and customization systems 42, 44, 46, 48, 50, and 52 may provide for functionality not found natively in the CAR system 30, the CAD system 32, the CAM/CIM system 36, the CMM system 38 and/or the PDM system 40. For example, computer code or instructions may be added to the systems 30, 32, 34, 36, and/or 38 via shared libraries, modules, software subsystems and the like, included in the extensibility and customization systems 42, 44, 46, 48, 50, and/or 52. The extensibility and customization systems 42, 44, 46, 48, 50, and 52 may also use application programming interfaces (APIs) included in their respective systems 30, 32, 34, 36, and 38 to execute certain functions, objects, shared data, software systems, and so on, useful in extending the capabilities of the CAR system 30, the CAD system 32, the CAM/CIM system 36, the CMM system 38 and/or the PDM system 40. By enabling the processes 12, 14, 16, 18, 20, and 22, for example, via the systems 30, 32, 34, 36, and 38 and their respective extensibility and customization systems 42, 44, 46, 48, 50, and 52, the techniques described herein may provide for a more efficient "cradle-to-grave" product lifecycle management (PLM).

Figure 3:
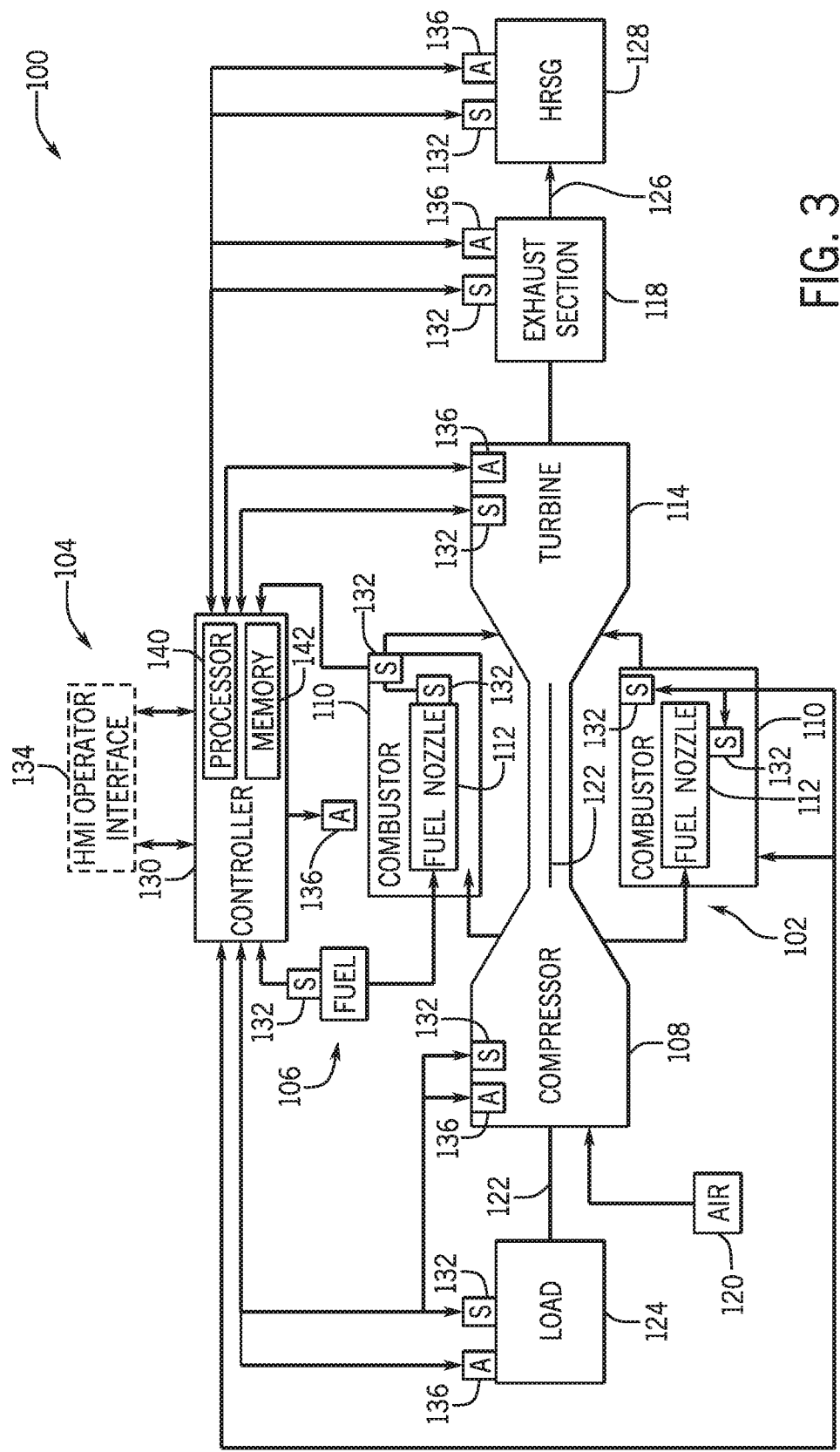
FIG. 3 is block diagram of an industrial system that may be conceived, designed, engineered, manufactured, and/or service and tracked by the CAx system of FIG. 1, in accordance with an aspect of the present disclosure.

It may be beneficial to describe a machine that would incorporate one or more parts manufactured and tracked by the processes 12, 14, 16, 18, 20, and 22, for example, via the CAx system 10. Accordingly, FIG. 3 illustrates an example of a power production system 100 that may be entirely (or partially) conceived, designed, engineered, manufactured, serviced, and tracked by the CAx system 10. As illustrated in FIG. 1, the power production system 100 includes a gas turbine system 102, a monitoring and control system 104, and a fuel supply system 106. The gas turbine system 102 may include a compressor 108, combustion systems 110, fuel nozzles 112, a gas turbine 114, and an exhaust section 118. During operation, the gas turbine system 102 may pull air 120 into the compressor 108, which may then compress the air 120 and move the air 120 to the combustion system 110 (e.g., which may include a number of combustors). In the combustion system 110, the fuel nozzle 112 (or a number of fuel nozzles 112) may inject fuel that mixes with the compressed air 120 to create, for example, an air-fuel mixture.

The air-fuel mixture may combust in the combustion system 110 to generate hot combustion gases, which flow downstream into the turbine 114 to drive one or more turbine stages. For example, the combustion gases may move through the turbine 114 to drive one or more stages of turbine blades, which may in turn drive rotation of a shaft 122. The shaft 122 may connect to a load 124, such as a generator that uses the torque of the shaft 122 to produce electricity. After passing through the turbine 114, the hot combustion gases may vent as exhaust gases 126 into the environment by way of the exhaust section 118. The exhaust gas 126 may include gases such as carbon dioxide ($CO_2$), carbon monoxide (CO), nitrogen oxides ($NO_x$), and so forth.

The exhaust gas 126 may include thermal energy, and the thermal energy may be recovered by a heat recovery steam generation (HRSG) system 128. In combined cycle systems, such as the power production system 100, hot exhaust 126 may flow from the gas turbine 114 and pass to the HRSG 128, where it may be used to generate high-pressure, high-temperature steam. The steam produced by the HRSG 128 may then be passed through a steam turbine engine for further power generation. In addition, the produced steam may also be supplied to any other processes where steam may be used, such as to a gasifier used to combust the fuel to produce the untreated syngas. The gas turbine engine generation cycle is often referred to as the "topping cycle," whereas the steam turbine engine generation cycle is often referred to as the "bottoming cycle." Combining these two cycles may lead to greater efficiencies in both cycles. In particular, exhaust heat from the topping cycle may be captured and used to generate steam for use in the bottoming cycle.

In certain embodiments, the power production system 100 may also include a controller 130. The controller 130 may be communicatively coupled to a number of sensors 132, a human machine interface (HMI) operator interface 134, and one or more actuators 136 suitable for controlling components of the power production system 100. The actuators 136 may include valves, switches, positioners, pumps, and the like, suitable for controlling the various components of the power production system 100. The controller 130 may receive data from the sensors 132, and may be used to control the compressor 108, the combustors 110, the turbine 114, the exhaust section 118, the load 124, the HRSG 128, and so forth.

In certain embodiments, the HMI operator interface 134 may be executable by one or more computer systems of the power production system 100. A plant operator may interface with the power production system 100 via the HMI operator interface 44. Accordingly, the HMI operator interface 134 may include various input and output devices (e.g., mouse, keyboard, monitor, touch screen, or other suitable input and/or output device) such that the plant operator may provide commands (e.g., control and/or operational commands) to the controller 130.

The controller 130 may include a processor(s) 140 (e.g., a microprocessor(s)) that may execute software programs to perform the disclosed techniques. Moreover, the processor 140 may include multiple microprocessors, one or more "general-purpose" microprocessors, one or more special-purpose microprocessors, and/or one or more application specific integrated circuits (ASICS), or some combination thereof. For example, the processor 39 may include one or more reduced instruction set (RISC) processors. The controller 130 may include a memory device 142 that may store information such as control software, look up tables, configuration data, etc. The memory device 142 may include a tangible, non-transitory, machine-readable medium, such as a volatile memory (e.g., a random access memory (RAM)) and/or a nonvolatile memory (e.g., a read-only memory (ROM), flash memory, a hard drive, or any other suitable optical, magnetic, or solid-state storage medium, or a combination thereof).

Digital product definitions for the aforementioned parts of the industrial machinery may be generated to aid in the processes 12, 14, 16, 18, 20, and 22, for example, via the CAx system 10. In some embodiments, the processes described herein may be performed by CAD 32 or the like. However, it should be noted that other applications may perform these processes. By way of example, the digital product definitions may include objects (e.g., annotations, text, etc.) that may be difficult to view (e.g., too small or too large), as mentioned above.

Figure 4:
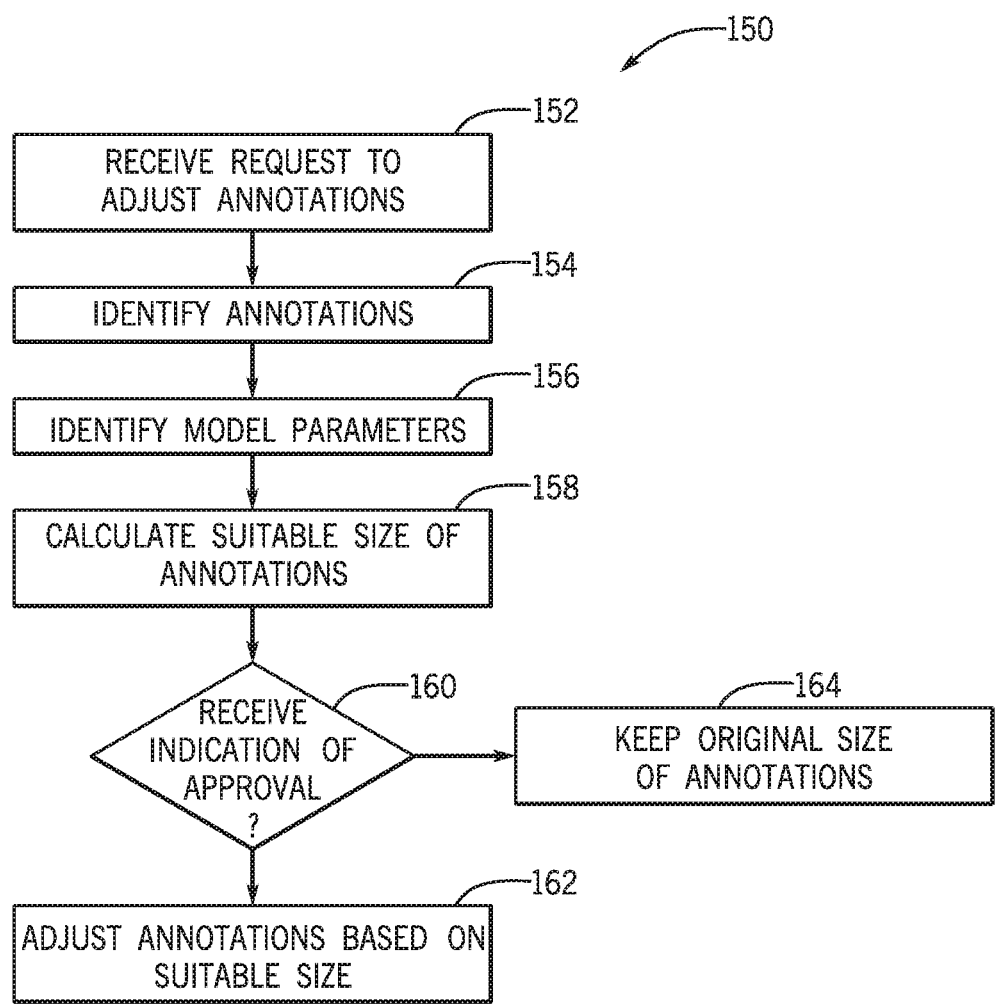
FIG. 4 is a process flow diagram illustrating an embodiment of a method for modifying objects presented via the CAx system of FIG. 1, in accordance with an aspect of the present disclosure.

With this in mind, FIG. 4 illustrates a process flow diagram 150 of an embodiment of a method for automatically adjusting (e.g., scaling) objects within a digital product definition and/or model of a part. Generally, the method illustrated in the process flow diagram 150 may be performed by a process of the CAD system 32. The processor may identify a digital product definition or model. The digital product definition or model may include annotations (e.g., or any other objects) that vary in size. Furthermore, the digital product definition may be amplified or minimized to generate a different model view. The generated view may also include annotations that may have become accordingly amplified or minimized, thereby making the annotations difficult to view, for instance.

After the CAD system has generated a part (e.g., 3D and/or 2D model) via its user interface, as described in detail above, models (e.g., digital product definitions) displaying various views of the various components and/or features of the may be generated. The generated models may contain annotations (e.g., text, part features, notes, callouts, etc.) of various sizes that may indicate part sizes, manufacturing detail, and/or other relevant information about the part. For example, a perspective view of the part may be generated, such that original model is oriented and zoomed out of to generate the perspective view. The perspective view of the part may contain, for example, hole callout, dimensions, and a bill of materials as annotations. However, since the perspective view zoomed out, the originally depicted annotations may be displayed too small to be legibly read. As such, it may be useful to automatically adjust annotations for different views.

With this in mind, in one embodiment, a processor of the CAD system 32 may execute computer-readable instructions stored in memory that cause the processor to receive a request to adjust the annotations presented (process block 152). In certain embodiments, the request to adjust the annotations may be a command indicated and/or selected on the user interface of the CAD system 32. Adjusting the annotations may include scaling the annotations. For example, the user interface of the CAD system may contain a drop down menu with an "annotation options" tab as a selectable option. After being selected, the "annotation options" tab expands to reflect options associated with the annotations present on the model. A user may select an option, such as "adjust/scale animations." Pushing the "adjust/scale animations" option on the user interface may cause the CAD system 32 to proceed to process block 154.

In some embodiments, when an option to generate a model or digital product definition is selected on the user interface of the CAD system 32, the CAD system 32 may automatically proceed to process block 154 without receiving a signal indicative of a request to adjust annotations.

After the CAD system 32 receives a request to scale the annotations, the CAD system 32 may execute instructions that cause its processor to identify each of the annotations (process block 154) displayed on the model. In certain embodiments, the CAD system 32 may scan the model (e.g., digital product definition) and identify each of the annotations. That is, if a portion of the part is not visible from a model view, the annotations associated with the portion of the part that is not on the model view may also not be visible (e.g., not identified as annotations). As such, in certain embodiments, the CAD system 32 may identify the annotations that are shown or visible on a model view. In further embodiments, the user interface may be customizable allow the user to manually identify (e.g., via a selection) certain annotations on the model view that the user wants to scale. For example, zooming in on a part may omit annotations regarding a manufacturing specification. The omitted annotations may be manually selected so that the CAD system 32 identifies the annotation and/or does not omit the annotation from the scaling operation.

After identifying the annotations, the process flow diagram 150, includes identifying the model parameters (process block 156). The model parameters may include the orientation (e.g., view) of the part. The orientation of the part may be a specific model view such as a front view, a real view, a side view, an isometric view, a parametric view, or any other suitable orientation of the part. Any of the aforementioned specific model views may be associated with a specific coordinate system (e.g., corresponding to an orientation of the part displayed in the model view), such that the coordinate system associated with the specific model views may also be identified as a model parameter.

Furthermore, identifying the model parameters (process block 156) may include identifying the dimensions (e.g., length and width) of the display of model. That is, the model parameters such as the dimensions of the display of the model may include the length and width of the window (e.g., boarders) of the CAD system displaying the model. In certain embodiments, identifying the dimension of the display of the model may include identifying the length and width of the paper that the model and its annotations may be displayed on. In certain embodiments, identifying the dimensions of the display of the model may also include identifying the size of the displayed portion of the model (e.g., such that the displayed portion may be bound by boarders of the display). For instance, if a view of the model is zoomed into a region of the part displayed in the model, such that the region of the part is a square region measuring (e.g., bound by a display with the dimensions of) five inches by five inches. The CAD system 32 may identify the dimensions (e.g., five inches by five inches) associated with this region of the part as model parameters.

In addition, identifying the model parameters (process block 156) may include identifying properties of the annotations, such as the number and type of characters included in each annotation. For example, for the word "circumference" displayed as an annotation on the model, the CAD system 32 may identify thirteen (e.g. as the number of characters) text letters (e.g., as the type of annotation) as a property of the annotation. Furthermore, the CAD system 32 may identify three arrows (e.g., annotations) pointing to a corner of the part displayed by the model. The CAD system 32 may identify three (e.g., as the number of characters) and arrow shapes (e.g., as the type of annotation) as the annotation properties, which may be identified as model parameters by the CAD system 32.

Although only a few examples for identifying model parameters are disclosed, in further embodiments, any other suitable (e.g., quantifiable) parameters indicative of the model may be identified as model parameters. In certain embodiments, the identified model parameters may be stored in data repositories transferred from the CAD system 32 for further use via the data sharing layer mentioned in the discussion of FIG. 2 or any other suitable system for storing and/or sharing data.

After identifying the annotations and model parameters, the CAD system 32 may calculate a suitable size for the annotations (process block 158) based at least in part on the model parameters identified, as discussed in detail below. The calculated suitable size may be a numerical quantity indicative of a font size (e.g., that indicates the size of the text that makes up the annotations displayed on the model) and may be determined in a number of ways.

In certain embodiments, the CAD system 32 may calculate the suitable size of the annotation (process block 158) by taking the dimensions of the display (e.g., window on the user interface) of the CAD system 32 that contains the part and its annotations, and then using the dimensions to calculate the suitable size of the annotation. For example, the CAD system 32 may process the length and width of the display of the CAD system 32 and determine an index. The index may be a numeric quantity that reflects the dimensions (e.g., length and width) of the display of the CAD system 32. The index may then be, for example, multiplied by a constant (e.g., pre-determined by the CAD system 32). The constant may correspond to the index (e.g., or any other model parameters), such that the CAD system 32 may determine the constant based at least in part on the dimensions of the display. For example, a 2D model may be displayed on a sheet of paper of any dimensions of length by width (e.g., 8.5" by 11"). The index may be the product of the length and width (e.g., 93.5). The index (e.g., 93.5) may be multiplied by a constant (e.g., 0.11562) to obtain a product of the index and constant. The product may correspond to the final font size (e.g., 14.6). This final font size may be uniformly applied to each annotation identified, displayed, or in a current view on the model (e.g., such that each annotation will be of font size 14.6).

Furthermore, in additional embodiments, the calculations for determining a suitable size for the annotations (process block 158) may utilize model parameters, such as the number of annotations present on the model. That is, the CAD system 32 may adjust the size of the annotations based at least in part on the identified number of annotations on the model. In certain embodiments, the CAD system 32 may reduce the size of the annotations if the CAD system 32 identifies more annotations than a given threshold number of, for example, identified annotations and/or number of total characters that make up the annotations. In further embodiments, the threshold may be designated in a spatial context, such as total characters or annotations per display area. For example, if the number of annotations and/or the number of total characters that make up the annotations exceed a first threshold value for their respective values, the CAD system 32 may reduce the size of the annotations (e.g., identified or displayed on the model). In addition, if the number of annotations and/or the number of total characters that make up the annotations is below a second threshold value for their respective numbers, the size of the a annotations may be calculated to be increased.

In certain embodiments, the suitable size for the identified annotations may be calculated and be uniformly applied to each identified annotation on the display the CAD system 32. For example, the CAD system 32 may identify the dimensions of the display, the size of the annotations identified in the display, and the number of annotation characters per display area. In addition, based on the identified dimensions of the display and the number of annotation characters per display area, the CAD system 32 may identify the annotation with a suitable size and uniformly apply the size and style of the said annotation to each annotation identified on the display. If no such annotation with a suitable size is identified by the CAD system 32, the CAD system 32 may calculate a suitable size based on the identified dimensions of the display and the number of annotation characters per display area (e.g., or any other identified model parameters), as mentioned above. The calculated suitable size may be uniformly applied to the annotations identified on the display.

It should be noted that any of the above-mentioned methods of calculating a suitable size for the annotations on the model may be used alone or in combination with one another. Furthermore, any other suitable methods may be used for calculating the suitable size for the annotations on the model. After the suitable size is calculated by the CAD system, a user may be prompted to approve of the calculated annotations size before the annotations size is implemented. As such, after the suitable size of the annotations is calculated, for example, a display prompt indicating a request to approve of the suitable size of the annotations may be propagated on the user interface of the CAD system 32.

After the display prompt (e.g., or any other request for approval) is propagated, the CAD system 32 analyzes inputs to identify if an indication of an approval is received (decision block 160). Such indication of approval may be a signal indicative of a choice for approval (e.g., of the calculated suitable annotation size) being selected on the user interface of the CAD system 32. In further embodiments, the indication of the approval may be independently generated based on a determination of whether the automated checklist has been met. For example, the checklist may include parameters related to whether the model is contained (e.g., bounded) within the display boarders, whether there is no physical overlap of annotations, whether the annotations are of the same size, etc. After the CAD system 32 determines that the checklist conditions have been met, an equivalent indication of approval may be generated by the CAD system 32.

After the CAD system 32 receives a signal indicative of an approval, the annotations are adjusted based on the suitable size (process block 162). That is, the annotations present on the model may be reduced in size, increased in size, adjusted in font, scaled, and/or other relevant adjustments may be made to the annotations, after a signal indicative of approval is received. Furthermore, the aforementioned method of calculating the suitable annotation size mentioned above may be incorporated to the model after an indication of approval is received. After the approval is received by the CAD system 32, the annotations on the model are accordingly adjusted.

Alternatively, if a signal indicative of approval is not received by the CAD system 32, the size of the annotations remains that of the original size (process block 164) and/or remains unchanged. Furthermore, if a signal indicative of a rejection of the calculations of a suitable size for the identified annotations is received by the CAD system 32, similarly, the size of the annotations may remain the original size and/or remain unchanged. As such, the suitable size for the identified annotations calculated above may not be incorporated to any of the annotations on the model. In further embodiments, the user interface may allow for selectively choosing which annotations on the model to apply the calculated suitable size.

In further embodiments, the above-mentioned process of adjusting and implementing the annotations sizes on the model by calculating a suitable size of the annotations may be applied automatically. As such, in certain embodiments, the process flow diagram 150, may not wait for an indication of an approval to adjust the annotations to a suitable size and may instead apply the changes dynamically. In other words, the above-mentioned methods of calculating the suitable size of the annotations may be applied to the annotations while the display of the model is being reduced or amplified in size and/or while a user zooms in or out of a view, without awaiting an approval. For example, while the window displaying the annotations is being reduced in size, the size of the identified annotations may uniformly decrease in size for clarity. As an alternate example, while the window displaying the annotations increases in size, the size of the identified annotations may uniformly increase in font size for clarity. As a further example, by zooming into a view, the size of the annotations may be reduced to maintain annotation size uniformity on the display despite the zooming in. As mentioned above, in certain embodiments, this increase or decrease in annotation scaling may not wait for an indication of an approval, thereby making the scaling and its implementations an automated process.

Figure 5:
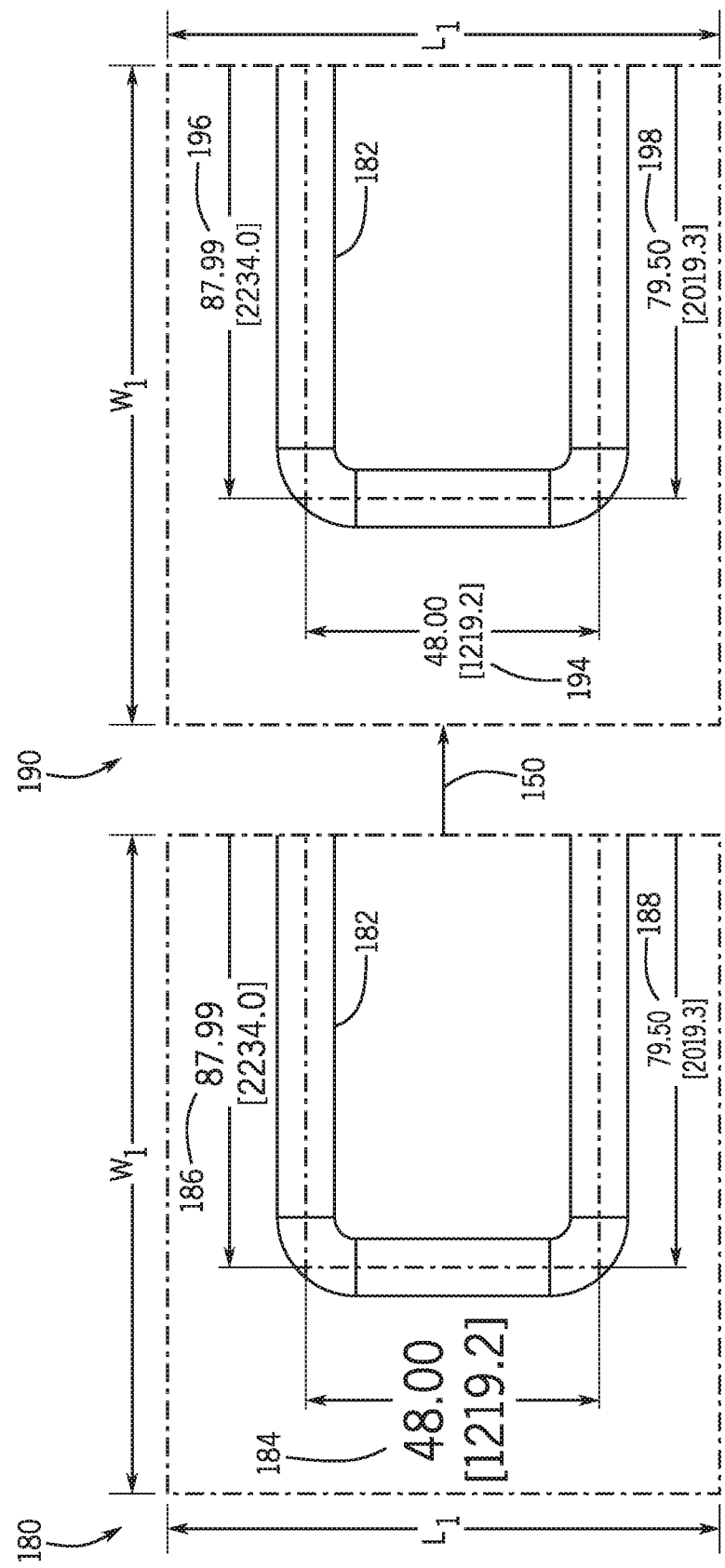
FIG. 5 is an illustration of a CAx digital product definition that depicts modifications applied to objects presented thereon, in accordance with an aspect of the present disclosure.

For context and as an example of the process flow diagram discussed above, FIG. 5 includes a sketch that illustrates how the annotations may be scaled (e.g., adjusted). A first display (e.g., digital product definition) 180 includes a part 182 (e.g., a pipe of industrial machinery) including three annotations, a first annotation 184, a second annotation 186, and a third annotation 188. The first display 180 of the part 182 has dimensions W1 by L1, where W1 is the width of the display 180 and L1 is the length of the display 180. As illustrated, the three annotations on the first display 180 are different in size. The first annotation 184 is larger than the second annotation 186, which in turn is larger than the third annotation 188. As such, the first display 180 is an example of the part 182 and its annotations (184, 186, and 188) that may be associated with a request to scale the annotations (e.g., based on the lack of uniformity in annotation size).

Furthermore, a second display (e.g., digital product definition) 190 includes the same part 182 (e.g., the pipe of industrial machinery) of the first display 180, and similarly, includes the same dimensions W1 by L1, where W1 is the width of the second display 190 and L1 is the length of the display 190. As such, the first display 180 is the same size (e.g., has the same width and length) as the second display 190. However, the second display 190 includes three annotations, a first annotation 194, a second annotation 196, and a third annotation 198 that are of uniform size because its annotations have been scale in accordance with some methods of the process 150 discussed in FIG. 4. That is, display 190 includes the same model parameters of display 180, but display 190 has annotations (194, 196, and 198) that have been adjusted based on a calculated suitable size for the annotations. The suitable size for the annotations may be calculated based at least in part on the model parameters, the number of annotations identified, the character length of the identified annotations, or any combination thereof. On the other hand, display 180 is an original model with initial annotations that have not been subject to process 150. As indicated by arrow 150, after the display 180 is subject to process 150, it changes to display 190. As such, the annotations of part 182 on display 180 are adjusted (e.g., uniformly scaled) to a calculated suitable size to create display 190 and accordingly adjust the annotations of part 182.

Technical effects of the present disclosure include systems and methods for modifying objects, such as annotations on digital product definitions for industrial machine parts depicted in design applications. The system that modifies these objects (e.g., and/or annotations) may receive a request to scale one or more objects depicted on a display. The system may identify the one or more objects of the model and determine the one or more model parameters of the model. After identifying the objects and determining the model parameters, the system may calculate a size for the objects of the model based on the model parameters, and accordingly scale the objects based on the calculated size for the objects. By scaling the objects displayed on the model, the clarity of the objects may be enhanced, thereby making the objects more legible.

This written description uses examples of the presently disclosed embodiments, including the best mode, and also to enable any person skilled in the art to practice the disclosed embodiments, including making and using any devices or systems and performing any incorporated methods. The patentable scope of the disclosed embodiments is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A system comprising:
  a display;
  a processor;
  memory storing instructions configured to cause the processor to:
    receive a request to scale one or more textual characters of a model depicted on the display, wherein the one or more textual characters comprise one or more textual annotations indicative of one or more features of the model;
    identify the one or more textual characters of the model and an original size of each of the one or more textual characters;
    determine whether a number of the one or more textual characters displayed on the model exceeds a threshold;
    determine one or more model parameters of the model, wherein the model parameters comprise information indicative of the one or more textual characters and at least two dimensions of the display;
    automatically calculate a uniform size for the one or more textual characters of the model based on the one or more model parameters, in response to the number exceeding the threshold; and
    scale the one or more textual characters to the uniform size based on the original size for each of the one or more textual characters and the uniform size, wherein the one or more textual characters are scaled, in response to the number exceeding the threshold, by:
      reducing a first size of a first textual character of the one or more textual characters to the uniform size;
      increasing a second size of a second textual character of the one or more textual characters to the uniform size; or
      a combination thereof.

2. The system of claim 1, wherein the one or more textual characters comprise text, one or more graphics, one or more tables, or any combination thereof, displayed on the model.

3. The system of claim 1, wherein the model comprises a portion of the one or more textual characters visible via the display, wherein the portion of the one or more textual characters visible via the display is bound by one or more borders of the display.

4. The system of claim 1, wherein the instructions that cause the processor to identify the one or more textual characters comprise manually receiving an input configured to identify the one or more textual characters.

5. The system of claim 1, wherein the instructions that cause the processor to identify the one or more textual characters comprise automatically identifying the one or more textual characters depicted via the display.

6. The system of claim 1, wherein the threshold comprises a first quantity indicative of the number of the one or more textual characters identified on the display or a second quantity indicative of the number of the one or more textual characters identified per unit area of the display.

7. The system of claim 1, wherein the instructions that cause the processor to scale the one or more textual characters comprise adjusting the original size of each of the one or more textual characters of the model based on the uniform size.

8. A method, comprising:
  receiving, via a processor, a request via a user interface to scale one or more textual characters of a model depicted on a display, wherein the one or more textual characters comprise one or more textual annotations indicative of one or more features of the model;
  identifying, via the processor, the one or more textual characters of the model and an original size of each of the one or more textual characters;
  determining, via the processor, whether a number of the one or more textual characters displayed on the model exceeds a threshold;

determining, via the processor, one or more model parameters of the model, wherein the one or more model parameters comprise information indicative of the one or more textual characters and at least two dimensions of the display;

automatically calculating, via the processor, a uniform size for the one or more textual characters of the model based on the one or more model parameters and in response to the number exceeding the threshold; and scaling, via the processor, the one or more textual characters to the uniform size based on the original size for each of the one or more textual characters and the uniform size, wherein the one or more textual characters are scaled, in response to the number exceeding the threshold, by:
 reducing a first size of a first textual character of the one or more textual characters to the uniform size;
 increasing a second size of a second textual character of the one or more textual characters to the uniform size; or
 a combination thereof.

9. The method of claim 8, wherein identifying the one or more textual characters comprises automatically identifying a portion of the one or more textual characters visible via the display, wherein the portion of the one or more textual characters visible via the display is bound by one or more borders of the display.

10. The method of claim 8, wherein automatically calculating the uniform size for the one or more textual characters is based at least on one or more dimensions of the display.

11. The method of claim 8, wherein automatically calculating the uniform size for the one or more textual characters comprises:
 determining whether the number of the one or more textual characters displayed on the model are less than an other threshold; and
 determining the uniform size of the one or more textual characters when the number is less than the other threshold.

12. The method of claim 8, wherein scaling the one or more textual characters comprises uniformly scaling the one or more textual characters identified on the display.

13. A tangible, non-transitory, and computer-readable medium having instructions stored thereon that, when executed by one or more processors of a computer-aided design (CAD) system, are configured to cause the one or more processors to:
 receive a request to scale one or more textual characters of a model depicted on a display, wherein the one or more textual characters comprise one or more textual annotations indicative of one or more features of the model;
 identify the one or more textual characters of the model and an original size of each of the one or more textual characters;
 determine whether a number of the one or more textual characters displayed on the model exceeds a threshold;
 determine one or more model parameters of the model, wherein the model parameters comprise information indicative of the one or more textual characters and at least two dimensions of the display;
 automatically calculate a uniform size for the one or more textual characters of the model based on the one or more model parameters and in response to the number exceeding the threshold; and
 scale the one or more textual characters to the uniform size based on the original size for each of the one or more textual characters and the uniform size, wherein the one or more textual characters are scaled, in response to the number exceeding the threshold, by:
  reducing a first size of a first textual character of the one or more textual characters to the uniform size;
  increasing a second size of a second textual character of the one or more textual characters to the uniform size; or
  a combination thereof.

14. The tangible, non-transitory, and computer-readable medium of claim 13, wherein the instructions that cause the one or more processors to identify the one or more textual characters comprises automatically identifying the one or more textual characters depicted via the display.

15. The tangible, non-transitory, and computer-readable medium of claim 13, wherein the instructions that cause the one or more processors to determine the one or more model parameters comprise determining one or more dimensions of the display, a first number of characters of each of the one or more textual characters, a second number of the one or more textual characters per unit area, a view of the model, or any combination thereof.

16. The tangible, non-transitory, and computer-readable medium of claim 15, wherein the one or more dimensions of the display comprise a length and width of the display.

* * * * *